United States Patent
Cohen et al.

(10) Patent No.: US 9,774,205 B2
(45) Date of Patent: Sep. 26, 2017

(54) SYSTEM AND METHOD FOR MONITORING A BATTERY IN AN UNINTERRUPTIBLE POWER SUPPLY

(71) Applicant: SCHNEIDER ELECTRIC IT CORPORATION, West Kingston, RI (US)

(72) Inventors: Daniel C. Cohen, Newtonville, MA (US); Mark R. Melanson, Chelmsford, MA (US)

(73) Assignee: SCHNEIDER ELECTRIC IP CORPORATION, West Kingston, RI (US)

( * ) Notice: Subject to any disclaimer, the term of this patent is extended or adjusted under 35 U.S.C. 154(b) by 269 days.

(21) Appl. No.: 14/654,943

(22) PCT Filed: Dec. 26, 2012

(86) PCT No.: PCT/US2012/071659
§ 371 (c)(1),
(2) Date: Jun. 23, 2015

(87) PCT Pub. No.: WO2014/105009
PCT Pub. Date: Jul. 3, 2014

(65) Prior Publication Data
US 2015/0333554 A1 Nov. 19, 2015

(51) Int. Cl.
*H02J 7/00* (2006.01)
*G01R 31/36* (2006.01)
*H02J 9/06* (2006.01)

(52) U.S. Cl.
CPC ........ *H02J 7/0068* (2013.01); *G01R 31/3606* (2013.01); *H02J 7/00* (2013.01);
(Continued)

(58) Field of Classification Search
CPC ..................................................... H02J 7/0068
See application file for complete search history.

(56) References Cited

U.S. PATENT DOCUMENTS 5,281,955 A 1/1994 Reich et al.
6,137,292 A 10/2000 Hirsch et al.
(Continued)

FOREIGN PATENT DOCUMENTS

CN 202221912 U 5/2012

OTHER PUBLICATIONS

Extended European Search Report from corresponding European Application No. 12890811.8 dated Jun. 20, 2016.
(Continued)

*Primary Examiner* — Daniel Puentes
(74) *Attorney, Agent, or Firm* — Lando & Anastasi, LLP

(57) ABSTRACT

An uninterruptible power supply (UPS) includes an input to receive input power, a power supply circuit coupled to the input, to convert input power received from the input, a battery coupled to the power supply circuit, to provide battery power to the power supply circuit as an alternative to input power, and an output coupled to the power supply circuit, to provide output power derived from at least one of the battery and the input power. The UPS also includes a controller, supported by the housing and coupled to the power supply circuit, the controller being configured to receive, from at least one sensor coupled to the controller, information relating to one or more environmental parameters of the uninterruptible power supply and adjust one or more test parameters of a battery test based on the one or more environmental parameters.

20 Claims, 3 Drawing Sheets

(52) U.S. Cl.
CPC ............ *H02J 7/0077* (2013.01); *H02J 9/062* (2013.01); *Y10T 307/625* (2015.04)

(56) References Cited

U.S. PATENT DOCUMENTS

| | | |
|---|---|---|
| 7,880,438 B1 | 2/2011 | Cohen et al. |
| 2003/0085621 A1 | 5/2003 | Potega |
| 2003/0116154 A1 | 6/2003 | Butler et al. |
| 2005/0071093 A1 | 3/2005 | Stefan |
| 2009/0189451 A1* | 7/2009 | Roepke ............... G06F 1/30 307/66 |
| 2010/0250192 A1 | 9/2010 | Deokar et al. |
| 2011/0227414 A1 | 9/2011 | Fischer |

OTHER PUBLICATIONS

Notification of Transmittal of the International Search Report and the Written Opinion of the International Searching Authority from corresponding PCT/US2012/071659 dated Mar. 15, 2013.

Pascoe et al. "Automated battery test system." In: Measurement, vol. 34, issue 4, Dec. 1-20, 2003, pp. 325-345 (online). (retrieved on Feb. 3, 2013 (Sep. 2, 2013)) Retrieved from Science Direct <URL: http://www.sciencedirect.com/science/article/pii/502632241 03000885>, entire document.

* cited by examiner

SYSTEM AND METHOD FOR MONITORING A BATTERY IN AN UNINTERRUPTIBLE POWER SUPPLY

This application is a U.S. National Stage Application under 35 U.S.C. §371 from International Application No. PCT/US2012/071659, filed Dec. 26, 2012, which is hereby incorporated by reference in its entirety for all purposes.

BACKGROUND OF THE DISCLOSURE

Field of the Disclosure

At least one embodiment in accordance with the present disclosure relates generally to systems and methods for providing uninterruptible power and more specifically to control systems and methods used in an uninterruptible power supply (UPS) to monitor the function to and life expectancy of one or more batteries provided in a UPS.

Discussion of Related Art

The use of uninterruptible power supplies to provide regulated, uninterrupted power for sensitive and/or critical loads, such as computer systems and other data processing systems, is known. A number of different UPS products are available including those identified under the trade name Smart-UPS® from APC by Schneider Electric, Inc. of West Kingston, R.I. In a typical UPS, a battery is used to provide backup power for a critical load during blackout or brownout conditions. A user of a typical UPS is able to configure and control the UPS either through a computer coupled to the UPS or using through a user interface of the UPS itself.

SUMMARY OF THE DISCLOSURE

One aspect of the present disclosure is directed to a system for an uninterruptible power supply (UPS) including an input to receive input power, a power supply circuit coupled to the input, to convert input power received from the input, a battery coupled to the power supply circuit, to provide battery power to the power supply circuit as an alternative to input power, and an output coupled to the power supply circuit, to provide output power derived from at least one of the battery and the input power. The UPS also includes a controller, supported by the housing and coupled to the power supply circuit, the controller being configured to receive, from at least one sensor coupled to the controller, information relating to one or more environmental parameters of the uninterruptible power supply and adjust one or more test parameters of a battery test based on the one or more environmental parameters.

In some embodiments, the test parameters include a time of the battery test.

In some embodiments, the test parameters include an interval between the battery test and a subsequent battery test.

In some embodiments, the test parameters include a length of the battery test.

In some embodiments, the environmental parameters include a service length of the battery.

In some embodiments, the environmental parameters include a time since a previous discharge of the battery.

In some embodiments, the environmental parameters include an ambient temperature.

In some embodiments, the environmental parameters include a percentage of rated power drawn by a load.

Another aspect is directed toward a method for testing a battery on an uninterruptible power supply, the method including monitoring one or more environmental parameters of the uninterruptible power supply and adjusting one or more test parameters of a battery test based on the one or more environmental parameters.

Another aspect is directed toward a computer readable medium having stored thereon sequences of instruction including instructions that will cause a processor to receive information relating to one or more environmental parameters of an uninterruptible power supply and adjust one or more test parameters of a battery test based on the one or more environmental parameters.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
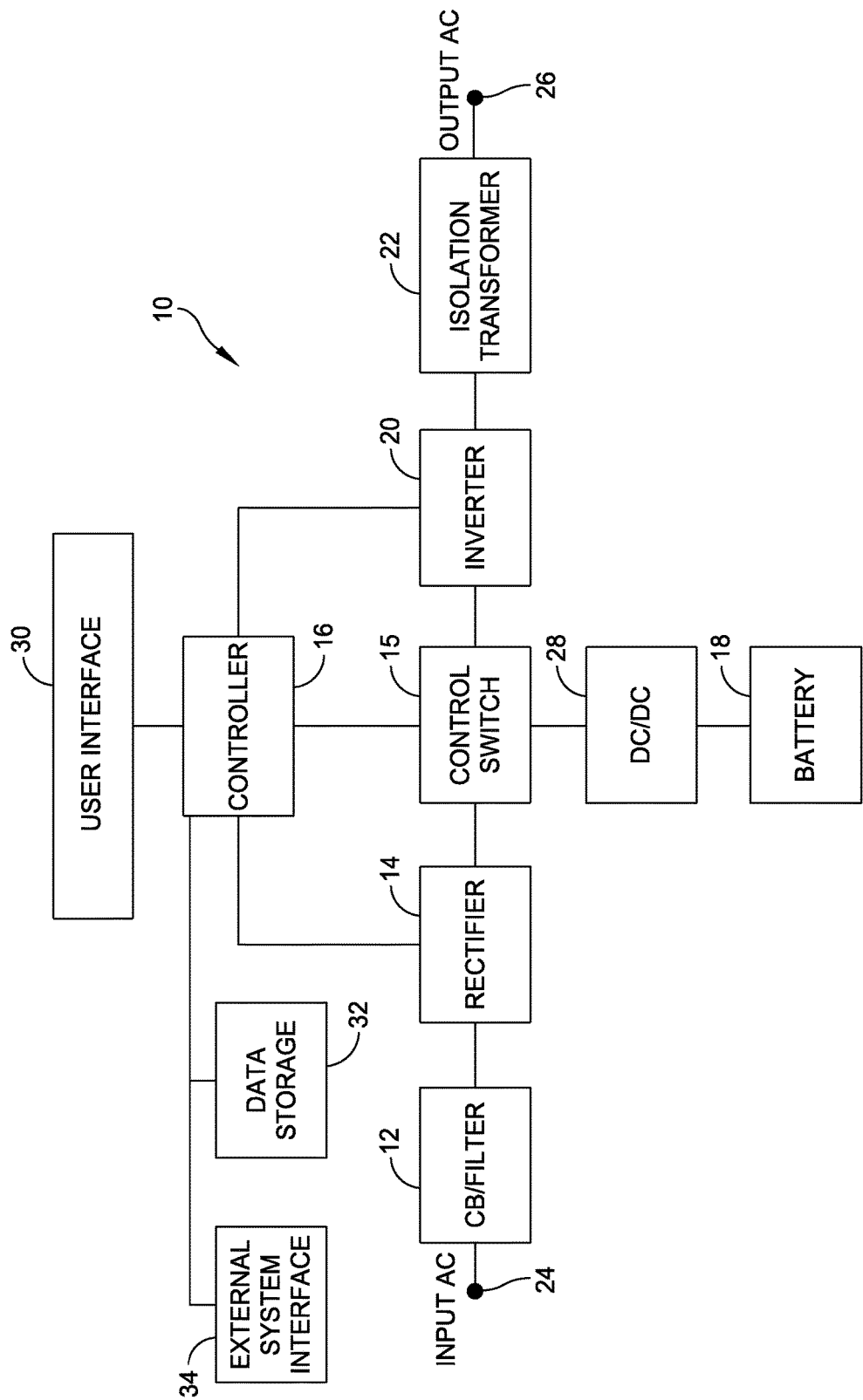
FIG. 1 is a schematic block diagram of a UPS.

At least some embodiments in accordance with the present disclosure relate to systems and processes for providing improved control, monitoring and/or configuration of uninterruptible power supply (UPS) batteries. Battery tests and monitoring of key parameters can provide information to users, such as a state of the battery, a health of the battery, estimated runtimes of the battery, probability or occurrence of battery failure, state of charge, and an estimation of remaining life. Users can use the information provided by battery tests, for example, to determine when a battery should be replaced. More accurate information regarding the battery can be obtained by more frequent battery tests. However, battery tests can involve discharging the battery, reducing the battery lifespan and leaving less backup power available to the UPS until the battery is recharged. Thus, battery tests can be scheduled according to an algorithm to optimize factors including accurate battery information, battery life, and UPS preparedness. The UPS can monitor environmental parameters and adjust one or more test parameters based on at least one of the environmental parameters. For example, tests can be rescheduled based on information obtained through normal usage of the UPS. If the battery is discharged through normal usage, the UPS can monitor the battery performance during the discharge and use the information obtained, in place of a separate battery test.

The aspects disclosed herein in accordance with the present disclosure, are not limited in their application to the details of construction and the arrangement of components set forth in the following description or illustrated in the drawings. These aspects are capable of assuming other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

FIG. 1 shows an on-line UPS 10 used to provide regulated, uninterrupted power in accordance with one embodiment of the disclosure. The UPS 10 includes an input circuit breaker/filter 12, a rectifier 14, a control switch 15, a controller 16, a battery 18, an inverter 20, an isolation transformer 22, a DC/DC converter 28, a user interface 30, data storage 32 and external system interface 34. The UPS also includes an input 24 for coupling to an AC power source, and an outlet 26 for coupling to a load.

The UPS 10 operates as follows. The circuit breaker/filter 12 receives input AC power from the AC power source through the input 24, filters the input AC power and provides filtered AC power to the rectifier 14. The rectifier 14 rectifies the input voltage. The DC/DC converter 28 regulates DC power from the battery 18. The control switch 15 to receives the rectified power and also receives the DC power from the DC/DC converter 28. The controller 16 determines whether the power available from the rectifier 14 is within predetermined tolerances, and if so, controls the control switch 15 to provide the power from the rectifier 14 to the inverter 20. If the power from the rectifier 14 is not within the predetermined tolerances, which may occur because of "brown out" or "black out" conditions, or due to power surges, then the controller 16 controls the control switch 15 to provide the DC power from the battery 18 via DC/DC converter 28 to the inverter 20.

In the shown embodiment, the controller 16 is coupled to the rectifier 14, the control switch 15 and the inverter 20. In addition, the controller 16 is coupled to various sensors in the UPS 10 to monitor parameters of the battery 18 and the DC/DC converter 28. The controller 16 is configured to receive information from the rectifier 14 when a "brown out" or "black out" condition occurs. Such a condition may occur when power to the input 24 is terminated. In other embodiments, the controller may be coupled to other components of the UPS 10 including the input 24, the breaker/filter 12, the isolation transformer 22, the DC/DC converter 28 and/or the battery 18.

The inverter 20 of the UPS 10 receives DC power and converts the DC power to AC power and regulates the AC power to predetermined specifications. The inverter 20 provides the regulated AC power to the isolation transformer 22. The isolation transformer 22 is used to increase or decrease the voltage of the AC power from the inverter 20 and to provide isolation between a load and the UPS 10. The isolation transformer 22 is an optional device, the use of which is dependent on UPS output power specifications. Depending on the capacity of the battery 18 and the power requirements of the load, the UPS 10 can provide power to the load during brief power source dropouts or for extended power outages or when power to the UPS is otherwise compromised.

Using data stored in associated memory, the controller 16 performs one or more instructions or procedures that may result in manipulated data, and the controller monitors and controls operation of the UPS 10. In some examples, the controller 16 may include one or more processors or other types of controllers. In one example, the controller 16 is a commercially available, general purpose processor. In another example, the controller 16 performs a portion of the functions disclosed herein on a general purpose processor and performs another portion using an application-specific integrated circuit (ASIC) tailored to perform particular operations. As illustrated by these examples, embodiments in accordance with the present disclosure may perform the operations described herein using many specific combinations of hardware and software and the disclosure is not limited to any particular combination of hardware and software components.

The data storage 32 stores computer readable information required for the operation of the UPS 10. This information may include, among other information, data subject to manipulation by the controller 16 and instructions that are executable by the controller 16 to manipulate data. Thus, in some embodiments, the data storage 32 can receive and store or retrieve and provide this computer readable information. The data storage 32 may include relatively high performance, volatile, random access memory such as a dynamic random access memory (DRAM) or static memory (SRAM) or may include a nonvolatile storage medium such as read-only memory (ROM), magnetic disk, flash memory, CD, DVD or one or more electrical switches, such as a dip switch. In one example, the data storage 32 includes both volatile and non-volatile storage. Various examples in accordance with the present invention can organize the data storage 32 into particularized and, in some cases, unique structures to perform the aspects and functions disclosed herein. In addition, these data structures may be specifically configured to conserve storage space or increase data exchange performance.

The external system interface 34 exchanges data with one or more external devices. These external devices may include any device configured to communicate using standards and protocols supported by the UPS 10. Examples of specific standards and protocols that the external system interface 34 may support include parallel, serial, and USB interfaces. Other examples of these supported protocols and standards include networking technologies such as UDP, TCP/IP and Ethernet technologies.

In some embodiments, the user interface 30 includes a display screen and a set of keys through which a user of the UPS 10 can monitor, control and configure operation of the UPS 10. In some embodiments, the user interface 30 includes a power button, a replace battery indicator, a warning indicator, an on-battery power indicator, an on-line power indicator, an interface display, a scroll up button, a scroll down button, an enter button, and an escape button.

In some embodiments, the UPS 10 provides an estimated time remaining until the battery 18 is unable to support the load in the event that the load is switched to the battery 18, such as due to a power outage. As the battery 18 gets older, the health of the battery may decrease, and the length of time that the battery 18 can support the load may shorten over time. The health of the battery 18 is typically affected by various factors, including time in service being charged, number of cycles of discharge, storage time, and temperature.

The UPS 10 can provide more accurate estimates of remaining battery run time by testing the battery 18 and recalibrating an expected remaining time algorithm with an actual discharge time. In some embodiments, the battery tests are conducted by discharging the battery 18 to at least a certain remaining capacity. For example, the battery 18 can be discharged until there is 25% of the battery capacity remaining. The UPS 10 monitors characteristics of the battery 18 while the battery 18 discharges. The characteristics can include, for example, voltage, state of charge, load applied to the battery 18, and discharge time. The UPS 10 uses measurements of the characteristics to update a calibration of the estimated remaining time, which the UPS 10 can more accurately report to the user.

However, the discharging of the battery 18 during the test may contribute to the decreasing of the health of the battery 18. The discharging of the battery 18 also results in the UPS 10 being less able to support a load on battery power until the battery 18 is recharged. Thus, the timing of the battery tests, as well as other test parameters, can be optimized based on environmental parameters.

Specific examples in accordance with the present invention include several variations of the UPS 104. For instance, in one example, the UPS 104 is configured to accept and distribute polyphase power, such as three phase power. In some examples, the outlet 226 includes a plurality of physical outlet groups, each of which includes a plurality of physical outlets. In other examples, the UPS 104 is configured to monitor and record, in data storage 232, the amount of power supplied via these outlet groups and outlets. In other examples, the UPS 104 is a standby UPS. In other examples, the UPS 104 is a line interactive UPS.

Figure 2:
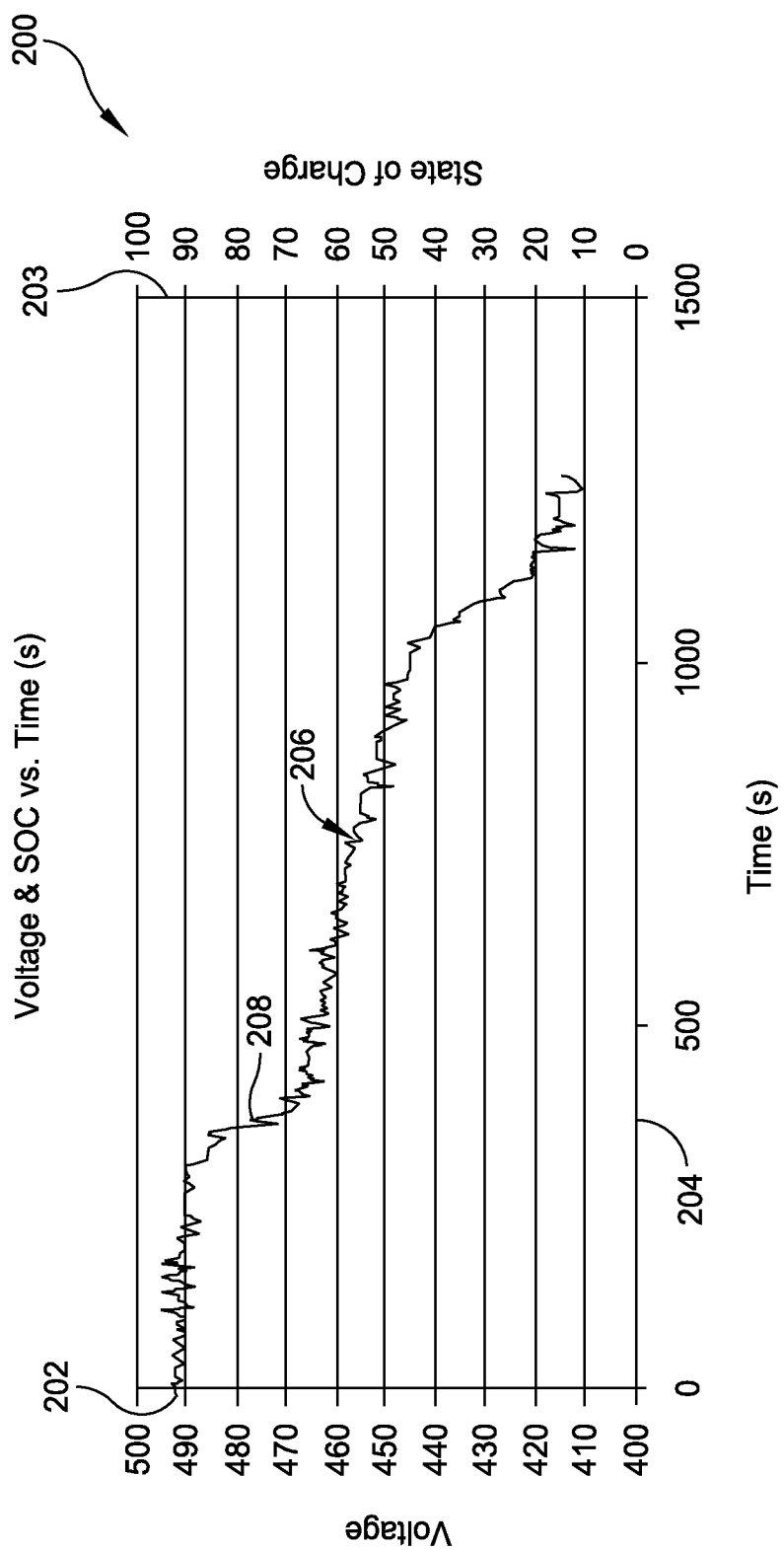
FIG. 2 is a graph of an example battery discharge of the UPS.

FIG. 2 shows a graph 200 of an example discharge of a battery. The graph 200 shows a voltage 202 and a state of charge 203 versus a time 204 of discharge. The time 204 is shown in seconds and reflects elapsed time after the start of a discharge cycle of the battery. A measured voltage 206 shows the voltage 202 of the battery over time 204 as the battery discharges. The measured voltage 206 is also used to determine the state of charge of the battery. The UPS also calculates an expected state of charge based on energy withdrawn from the battery and internally calibrated constants. The UPS compares the measured state of charge with the expected state of charge. A measured state of charge that is significantly lower than the expected state of charge is indicative of a battery failure.

In the example discharge, the measured voltage 206 includes a sudden drop 208, where the measured voltage 206 decreases in a shorter period of time relative to the rate of decrease in the measured voltage 206 over the remainder of the discharge cycle. The sudden drop 208 occurring prior to the end of a discharge cycle can be indicative of a battery cell failure.

Detecting the sudden drop 208 is one of the goals of the battery test. As the health of the battery decreases, the sudden drop 208 typically occurs earlier and earlier in the battery discharge cycle. Shorter battery tests can detect gross failures of the system, while longer tests can help detect earlier failures. For example, the system can include multiple batteries and/or battery cells in series and/or in parallel. Each of these batteries and/or battery cells can fail at varying degrees. The likelihood of battery failures increases as the battery ages. Thus, the battery can be tested less frequently early on in the life of the battery and the frequency of battery tests can increase as the battery ages. Less frequent tests early on in the life of the battery allows the battery to undergo fewer discharges, which affect the health of the battery, and still allow for detection of probable failures, as the probability of failure is lower at that stage of the battery life.

The UPS can also use shorter tests, for example, discharging the battery 15 to 50 percent (e.g., 30%). The shorter tests can be used in addition to or instead of the longer tests. The shorter tests can be used to detect fault conditions using the algorithms described above. If a fault condition is detected, a full battery test and runtime recalibration can be scheduled. The usage and frequency of the shorter tests can also be a test parameter adjusted by the UPS based on the environmental parameters.

The frequency of the battery tests can also be adjusted depending on other environmental factors that affect the health of the battery. For example, if a battery is discharged frequently, while the absolute age of the battery may be young, the frequent discharges can effectively age the battery. For example, battery tests can be conducted on a schedule according to Table 1.

TABLE 1

| Time Battery in Service | % Rated Life | Interval for Runtime Calibration |
| --- | --- | --- |
| 0-18 months | 0%-30% | 4 months |
| 18-36 months | 30%-60% | 3 months |
| 36-60 months | 60%-100% | 1.5 months |
| >60 months | >100% | 1 month |

According to the example table, the time in between each battery test for recalibrating expected runtime estimates is adjusted according to the time the battery is in service and the percentage rated life. For the first 18 months of the battery service time, the battery is tested every four months. For 18 to 36 months of service time, the battery is tested every 3 months. The adjusting of the interval can depend on either the service time of the battery and/or the percentage of rated life used. The percentage of rated life can be estimated by the battery storage temperature, time in service, time charging, and time in storage. The time in service can be adjusted based on the estimated percentage of rated life.

The frequency of the battery tests can also be adjusted based on the storage or operating temperature of the battery. If the battery is stored or operated at a higher temperature, the health of the battery may decrease faster relative to a battery stored or operated at a lower temperature. Thus, the frequency of the battery tests can be increased for batteries at higher temperatures. In some embodiments, the UPS detects the ambient temperature each minute and adjusts the time remaining until the next battery test based on the detected temperature. For example, the UPS can store a counter that indicates a time in seconds until the next scheduled battery test. The UPS can subtract seconds from the counter each minute according to the example schedule in table 2.

TABLE 2

| Temperature (° C.) | Seconds subtracted | Acceleration (%) |
| --- | --- | --- |
| 25 | 60 | 100 |
| 26 | 64 | 107 |
| 27 | 68 | 113 |
| 28 | 72 | 120 |
| 29 | 76 | 127 |
| 30 | 81 | 135 |
| 31 | 86 | 143 |
| 32 | 91 | 152 |
| 33 | 97 | 162 |
| 34 | 103 | 172 |
| 35 | 109 | 182 |
| 36 | 116 | 193 |
| 37 | 123 | 205 |
| 38 | 131 | 218 |
| 39 | 139 | 232 |
| 40 | 148 | 247 |
| 41 | 157 | 262 |
| 42 | 167 | 278 |
| 43 | 177 | 295 |
| 44 | 188 | 313 |
| 45 | 200 | 333 |
| 46 | 213 | 355 |
| 47 | 226 | 377 |
| 48 | 240 | 400 |
| 49 | 255 | 425 |
| 50 | 272 | 453 |
| 51 | 289 | 482 |
| 52 | 307 | 512 |
| 53 | 326 | 543 |
| 54 | 347 | 543 |
| 55 | 369 | 615 |
| 56 | 393 | 655 |
| 57 | 418 | 697 |

TABLE 2-continued

| Temperature (° C.) | Seconds subtracted | Acceleration (%) |
| --- | --- | --- |
| 58 | 444 | 740 |
| 59 | 473 | 788 |
| 60 | 503 | 838 |
| 61 | 535 | 892 |
| 62 | 569 | 948 |
| 63 | 606 | 1010 |
| 64 | 644 | 1073 |
| 65 | 686 | 1143 |
| 66 | 730 | 1217 |
| 67 | 777 | 1295 |

For example, if the UPS is new, the interval to the next battery test can be four months. The counter is set to 10,368,000, the number of seconds in four months. After a minute passes, the UPS detects the ambient temperature. If the ambient temperature is 25 degrees Celsius, the UPS subtracts 60 from the counter, leaving 10,367,940 seconds until the next battery test. After another minute passes, the UPS repeats the procedure. If the ambient temperature at this point is 26 degrees Celsius, instead of subtracting 60, the UPS will subtract 64, leaving 10,367,876 seconds until the next battery test. This effectively accelerates the battery test by 107%, which can be in accordance with a predictive algorithm of battery failure probability with respect to temperature. Each minute, the UPS can repeat this procedure, providing an adjustment to the test parameter based on the ambient temperature of the battery. These and other appropriate environmental parameters can be used to adjust parameters of the battery test, including frequency, length, and time of the battery test.

The battery tests can also be scheduled by a user to occur at times that minimize the risk incurred by discharging the battery for the test. For example, a user can provide windows of time that are optimal test windows. Optimal test windows can be times when the expected load on the UPS is relatively low. Additionally or alternatively, optimal time windows can include times when the expected criticality of the load on the UPS is relatively low. In some embodiments, the UPS can monitor power usage to suggest optimal times to the user. For example, when certain conditions are met, the UPS can provide a recommendation that a user run a calibration test.

The battery tests can also be adjusted based on a current load on the UPS. For example, the UPS can detect a percentage load on the UPS at the scheduled time of testing. The UPS can adjust the time of the test, delaying the test if the current load is not within a threshold window. For example, the UPS can delay the test if the current load on the UPS is above a maximum threshold, as the risk incurred by discharging the battery with such a high load can be greater than desired. Alternatively or additionally, the UPS can delay the test if the current load on the UPS is below a minimum threshold (e.g., 15%).

The test parameters can also be adjusted based on a current state of charge of the UPS. For example, a runtime recalibration can be more accurately measured if the state of charge of the UPS is 100% before the test begins.

Test parameters can also be adjusted based on information gathered from UPS usage. For example, if the battery is discharged through standard operational usage, such as providing power to a load during a blackout, the UPS can monitor the characteristics of the battery as it discharges through usage. If the discharge progresses far enough into the discharge cycle that the UPS receives a desired amount of information, the UPS can adjust the test parameters, such as skipping the next test or resetting the test interval.

Figure 3:
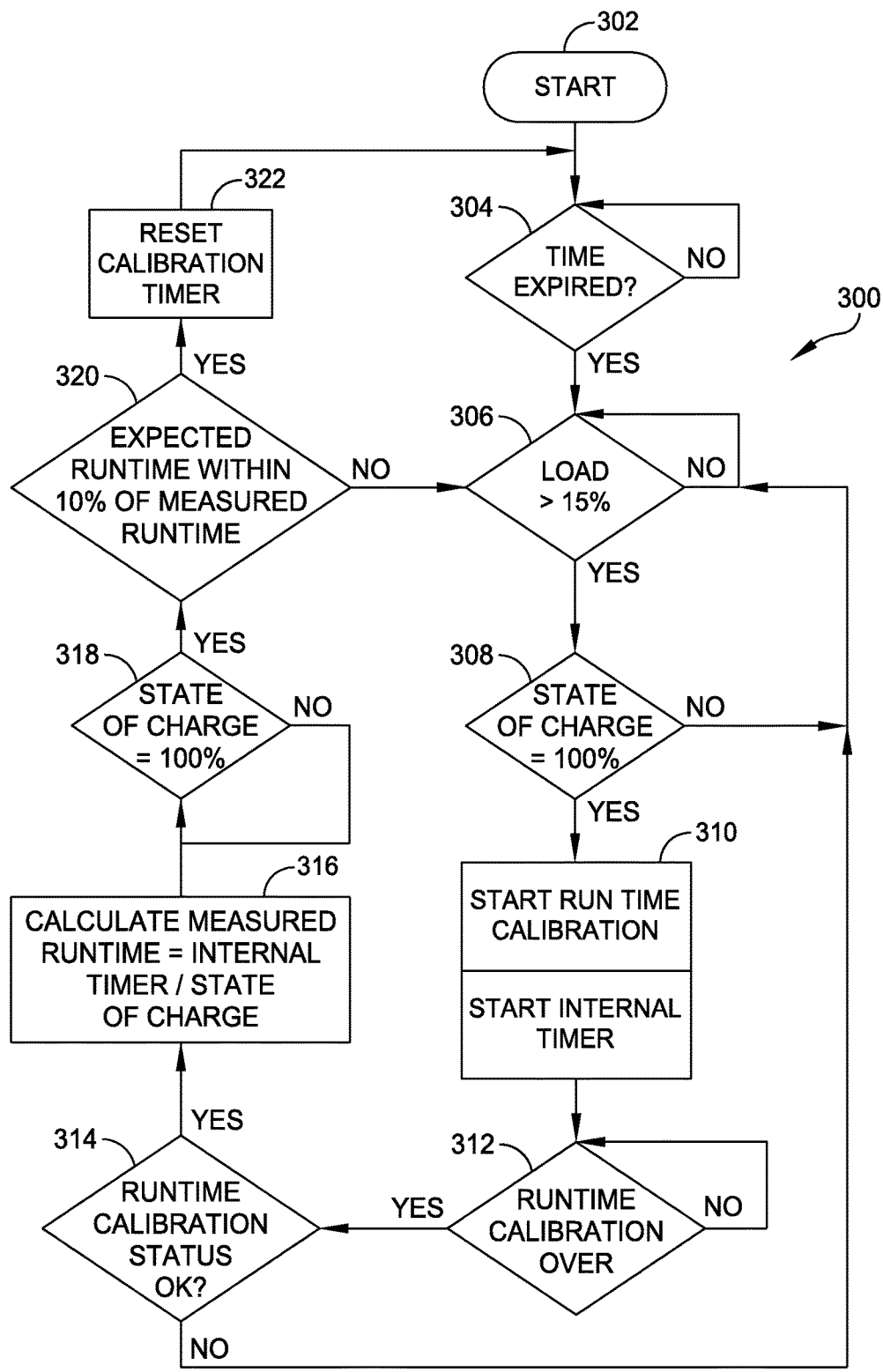
FIG. 3 is a flow chart of an example process performed by the UPS according to embodiments of the disclosure.

FIG. 3 shows an example process 300, which can be executed on the UPS 10 to adjust battery tests based on environmental parameters. The process 300 starts at act 302. At act 304, the UPS checks a calibration timer and determines whether the time to next battery test has expired. The calibration timer can be a clock counting down, or a counter that is adjusted for temperature as described above. The calibration timer can also be adjusted based on other environmental parameters. For example, if the UPS runs a short test and detects indications of a battery failure, the UPS can set the calibration timer to zero. Users can also request battery tests, which can set the calibration timer to zero. Alternatively, user-initiated tests can be considered separately, not affecting the scheduled battery tests.

If the time has not expired, the UPS returns to act 304 and checks again at a later time. If the time has expired, the UPS checks the load at act 306. The UPS checks if the load is above a predetermined threshold, such as 15%. If the load is not above the threshold, the UPS returns to act 306 and checks again at a later time. If the load is above the threshold, the UPS checks the state of charge at act 308. In some embodiments, the threshold is adjustable by the user. In some embodiments, the UPS also checks if the load is below a second, upper threshold.

At act 308, the UPS checks the state of charge of the battery. The UPS checks that the state of charge is above or at a predetermined threshold, such as 100%. If the state of charge is not at the threshold, the UPS returns to act 306 and checks again at a later time whether the load is still above the load threshold. If the state of charge is at or above the threshold, the UPS starts the battery test at act 310. In some embodiments, the threshold is adjustable by the user.

At act 310, the UPS starts runtime calibration. The UPS starts discharging the battery and starts an internal timer to measure the actual time the battery is able to support the load. The UPS also measures other variables that affect the health of the battery, such as load current, voltage, and temperature. At act 312, the UPS checks if the runtime calibration is over. If the runtime calibration is not over, the UPS returns to act 312 to check again at a later time. In some embodiments, the end of the runtime calibration is determined by a state of charge of the battery. For example, runtime calibration can run until the battery is 75% discharged. In some embodiments, the UPS can monitor the current and/or voltage output of the battery to determine the end of the runtime calibration. In some embodiments, the battery test can also be terminated at a threshold time, a threshold battery voltage, and/or by a user request.

If the runtime calibration is over the UPS checks whether the status of the runtime calibration is OK at act 314. In some embodiments, the status of the runtime calibration reflects whether the battery test completed successfully. If the battery test encountered no errors or warnings, the status can be set to OK. Conversely, if errors are encountered, the status can reflect any problems encountered. If the status is not OK, the UPS returns to act 306 to find the next opportunity to run the battery test.

If the status is OK, the UPS calculates the actual runtime at act 316. The UPS calculates the measured available runtime by using the measured time of discharge and dividing by the state of charge. For example, if the battery is discharged 75%, the measured time is divided by 0.75 to provide a calculated estimation of available runtime for a complete discharge of the battery, the length of time the battery will be able to support the load.

At act 318, the UPS recharges the battery and checks whether the state of charge has returned to 100%. If the state of charge is not 100%, the UPS returns to act 318 and checks again at a later time.

If the state of charge is 100%, the UPS compares the measured available runtime with the expected available runtime. If the expected available runtime is within a threshold amount (e.g., 10%) of the measured available runtime, the UPS resets the calibration timer according to environmental parameters, such as the age of the battery or number of discharge cycles the battery has undergone. If the expected available runtime is not within the threshold amount, the UPS returns to act 306 to run another battery test. In some embodiments, the UPS replaces the expected available runtime with the measured available runtime. Alternatively or additionally, the UPS can adjust the expected available runtime based on the measured available runtime. For example, the UPS can average the expected and measured available runtimes or use any appropriate algorithm to adjust he expected available runtime to provide a more accurate estimation. In some embodiments, the threshold amount between the expected available runtime and measured available runtime can be adjusted by the user.

While example thresholds, measurements, and projections have been provided above, such as the figures of Tables 1 and 2, any other appropriate figures can be used. In some embodiments, the figures can be adjusted during the lifetime of the battery, for example, based on environmental parameters or other modeling algorithms. In some embodiments, different segments of time can be used for decrementing the counter, along with different predictive algorithms.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. An uninterruptible power supply comprising:
   an input to receive input power;
   a power supply circuit coupled to the input, to convert input power received from the input;
   a battery coupled to the power supply circuit, to provide battery power to the power supply circuit as an alternative to input power;
   an output coupled to the power supply circuit, to provide output power derived from at least one of the battery and the input power;
   a controller coupled to the power supply circuit, the controller being configured to:
      receive, from at least one sensor coupled to the controller, information relating to one or more environmental parameters of the uninterruptible power supply; and
      adjust one or more test parameters of a battery test process based on the one or more environmental parameters, wherein the test parameters include an interval between a first battery test and a subsequent battery test.

2. The uninterruptible power supply of claim 1, wherein the test parameters include a time of the first battery test.

3. The uninterruptible power supply of claim 1, wherein the test parameters include a length of the first battery test.

4. The uninterruptible power supply of claim 1, wherein the environmental parameters include a service length of the battery.

5. The uninterruptible power supply of claim 1, wherein the environmental parameters include a time since a previous discharge of the battery.

6. The uninterruptible power supply of claim 1, wherein the environmental parameters include an ambient temperature.

7. The uninterruptible power supply of claim 1, wherein the environmental parameters include a percentage of rated power drawn by a load.

8. The uninterruptible power supply of claim 1, wherein the controller is further configured to periodically receive the information relating to the one or more environmental parameters and adjust the one or more test parameters based on the periodically received information, and wherein the one or more test parameters includes a time remaining until the subsequent battery test maintained by a calibration timer and adjusting the one or more test parameters includes adjusting the calibration timer.

9. A method for testing a battery on an uninterruptible power supply, the method comprising;
   monitoring one or more environmental parameters of the uninterruptible power supply; and
   adjusting one or more test parameters of a battery test process based on the one or more environmental parameters, wherein adjusting the one or more test parameters includes adjusting an interval between a first battery test and a subsequent battery test.

10. The method of claim 9, wherein adjusting the one or more test parameters include adjusting a time of the first battery test.

11. The method of claim 9, wherein adjusting the one or more test parameters includes adjusting a length of the first battery test.

12. The method of claim 9, wherein monitoring the one or more environmental parameters includes monitoring a service length of the battery.

13. The method of claim 9, wherein monitoring the one or more environmental parameters includes monitoring a time since a previous discharge of the battery.

14. The method of claim 9, wherein monitoring the one or more environmental parameters includes monitoring an ambient temperature.

15. The method of claim 9, wherein monitoring the one or more environmental parameters includes monitoring a percentage of rated power drawn by a load.

16. The method of claim 9, wherein monitoring the one or more environmental parameters further includes monitoring the one or more environmental parameters periodically, wherein the one or more test parameters includes a time remaining until a next scheduled battery test maintained by a calibration timer, and wherein adjusting the one or more test parameters further includes adjusting the calibration timer based on the one or more environmental parameters monitored periodically.

17. A computer readable medium having stored thereon sequences of instruction including instructions that will cause a processor to:
   receive information relating to one or more environmental parameters of an uninterruptible power supply;
   adjust one or more test parameters of a battery test process based on the one or more environmental parameters; and
   adjust an interval between a first battery test and a subsequent battery test.

18. The computer readable medium of claim 17, further including instructions that will cause the processor to:
adjust a time of the first battery test.

19. The computer readable medium of claim 17, further including instruction that will cause the processor to:
monitor one of a service length of the battery, a time since a previous discharge of the battery, an ambient temperature, or a percentage of rated power drawn by a load.

20. The computer readable medium of claim 17, wherein in receiving the one or more environmental parameters the processor is further configured to receive the one or more environmental parameters periodically, wherein in adjusting the one or more test parameters the processor is further configured to adjust the one or more test parameters based on the periodically received information, and wherein the one or more test parameters includes a time remaining until a next scheduled battery test maintained by a calibration timer and in adjusting the one or more test parameters the processor is further configured to adjust the calibration timer based on the periodically received information.

\* \* \* \* \*